United States Patent
Voss

(10) Patent No.: US 9,142,950 B2
(45) Date of Patent: Sep. 22, 2015

(54) CIRCUIT ARRANGEMENT HAVING AN OVERLOAD PROTECTION FOR GALVANIC ISOLATION UNITS

(71) Applicant: WAGO Verwaltungsgesellschaft mbH, Minden (DE)

(72) Inventor: Christian Voss, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 14/084,779

(22) Filed: Nov. 20, 2013

(65) Prior Publication Data

US 2014/0139962 A1   May 22, 2014

(30) Foreign Application Priority Data

Nov. 22, 2012   (DE) .................. 10 2012 111 278

(51) Int. Cl.
| | |
|---|---|
| H02H 3/20 | (2006.01) |
| H02H 3/10 | (2006.01) |
| H02H 9/00 | (2006.01) |
| H03K 17/0814 | (2006.01) |
| H03K 17/795 | (2006.01) |
| H04B 10/80 | (2013.01) |
| H04L 25/26 | (2006.01) |
| H04L 25/02 | (2006.01) |
| H02H 9/02 | (2006.01) |

(Continued)

(52) U.S. Cl.
CPC .............. *H02H 3/10* (2013.01); *H02H 9/008* (2013.01); *H03K 17/08146* (2013.01); *H03K 17/7955* (2013.01); *H04B 10/802* (2013.01); *H04L 25/0266* (2013.01); *H04L 25/26* (2013.01); *H02H 3/023* (2013.01); *H02H 9/02* (2013.01); *H02H 9/041* (2013.01); *H02M 3/33523* (2013.01)

(58) Field of Classification Search
USPC ....................................... 361/91.1, 91.6, 93.1
See application file for complete search history.

(56) References Cited

U.S. PATENT DOCUMENTS

| | | | |
|---|---|---|---|
| 4,420,840 A | 12/1983 | Livermore | |
| 4,639,727 A | 1/1987 | Blasius et al. | |

(Continued)

FOREIGN PATENT DOCUMENTS

| | | |
|---|---|---|
| DE | 39 07 033 | 9/1990 |
| DE | 39 31 537 | 4/1991 |

(Continued)

OTHER PUBLICATIONS

European Search Report for corresponding European Application No. 13193989.4 dated Apr. 28, 2014.

(Continued)

*Primary Examiner* — Danny Nguyen
(74) *Attorney, Agent, or Firm* — Renner, Otto, Boisselle & Sklar, LLP

(57) ABSTRACT

A circuit arrangement having an overload protection for galvanic isolation units for galvanic isolation from one another is described. The galvanic isolation units each have two regions galvanically isolated from one another and one of the regions has a control signal terminal and a base terminal. The circuit arrangement have at least two such galvanic isolation units. From at least two of the galvanic isolation units the base terminals of a region are electrically conductively connected to one another and are connected to a base potential via a common fuse connected in series.

15 Claims, 3 Drawing Sheets

Figure 1:
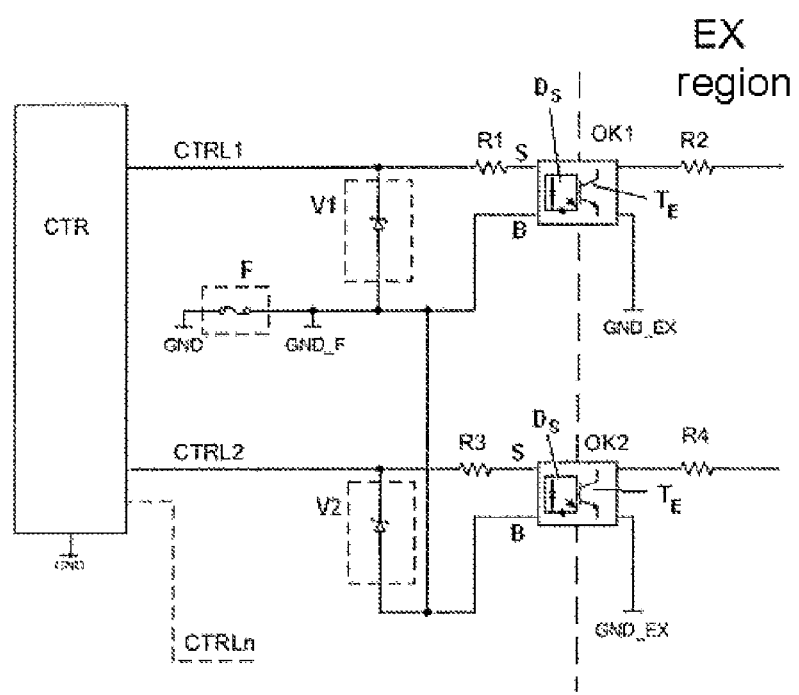

(51) Int. Cl.
  *H02M 3/335* (2006.01)
  *H02H 3/02* (2006.01)
  *H02H 9/04* (2006.01)

(56) References Cited

U.S. PATENT DOCUMENTS

| | | | |
|---|---|---|---|
| 4,777,375 | A | 10/1988 | Bozzuto, Jr. |
| 5,347,418 | A * | 9/1994 | Ando et al. .............. 361/104 |
| 5,570,263 | A | 10/1996 | Dion et al. |
| 6,760,437 | B1 | 7/2004 | Lim |
| 2004/0174648 | A1 | 9/2004 | Frey et al. |
| 2010/0085667 | A1 * | 4/2010 | Hallak et al. .............. 361/16 |
| 2012/0194200 | A1 * | 8/2012 | McDiarmid et al. ....... 324/509 |

FOREIGN PATENT DOCUMENTS

| | | |
|---|---|---|
| DE | 44 36 858 | 8/1996 |
| DE | 299 08 588 | 8/1999 |
| EP | 0 091 562 A2 | 10/1983 |
| EP | 0 263 246 A2 | 4/1988 |
| WO | 92/15139 | 9/1992 |
| WO | 01/76107 | 10/2001 |
| WO | 02/095895 | 11/2002 |

OTHER PUBLICATIONS

Schimanski, "Ueberspannungsschutz in Anlagen mit eigensicheren Stromkreisen", Elektrtechnik fuer die Automatisierung, Vogel Business Media GmbH & Co. KG, Bd. 74, Nr. 5, May 13, 1992, 4 pages.

* cited by examiner

CIRCUIT ARRANGEMENT HAVING AN OVERLOAD PROTECTION FOR GALVANIC ISOLATION UNITS

The invention relates to a circuit arrangement having an overload protection for galvanic isolation units for galvanic isolation of circuit regions from one another, wherein the galvanic isolation units each have two regions galvanically isolated from one another and at least one of the regions has a control signal terminal and a base signal terminal, wherein the circuit arrangement has at least two such galvanic isolation units.

Circuit arrangements of this type are required in particular in input and/or output modules in intrinsically safe, explosion-protected regions. They are used in conjunction with industrial controllers and building automation. Particular regulations have to be fulfilled when transmitting electrical signals in the transition region between intrinsically safe and non-intrinsically safe regions. These circuit regions have to be galvanically isolated from one another, such that the transmission of energy between these circuit regions to be galvanically isolated from one another is restricted to a minimal amount. Galvanic isolation units such as, in particular, optocouplers are used for this purpose.

For approval in the region exposed to explosion hazard, such optocouplers have to comply with the required air clearances and creepage paths. This requires additional particular outlay.

DE 299 08 588 U1 describes an apparatus for intrinsically safe optical data transmission between an intrinsically safe part and a non-intrinsically safe part of an electrical device, in which the transmitting diode is formed on one side and the radiation receiver on the other side, as electro-optical components isolated from one another. The transmitting diode emits radiation to the radiation receiver via a free path. By means of this construction in which transmitting diode and radiation receiver are constructed as discrete components totally isolated from one another, what is achieved is that the intrinsically safe part and the non-intrinsically safe part of the electrical device are completely galvanically isolated from one another.

In this context, DE 39 07 033 A1 discloses arranging an optical waveguide between the transmitting diode and the radiation receiver separate therefrom, wherein the transmitting diode is fed by a dedicated voltage supply in the intrinsically safe region.

These solutions require additional space and, on account of the mutually independent transmitting and receiving components, additional outlay.

In compliance with the existing safety standards, such as e.g. EN 50 020, galvanic isolation is permissible using standard optocouplers if an overvoltage protection device is present. Such an overvoltage protection device is described in DE 44 36 858 C2. It has at least two limiting members. Each limiting member can be formed either by a single limiting element or a series circuit comprising at least two limiting elements, wherein zener diodes, diodes, varistors or the like are primarily suitable as limiting elements.

In this case, a limiting element is respectively connected into the supply path of the assigned optocoupler. This prevents, in the overvoltage case, destruction of the optocoupler protected by the assigned limiting element, such as a fuse, for example, and the production of a conductive connection possibly with sparking between the non-intrinsically safe region and the intrinsically safe region of the optocoupler.

Taking this as a departure point, it is an object of the present invention to provide an improved circuit arrangement having an overload protection for galvanic isolation units in which structural space and circuit outlay are reduced whilst ensuring the required overload protection.

The object is achieved by means of the circuit arrangement comprising the features of claim 1.

Advantageous embodiments are described in the dependent claims.

For a circuit arrangement of the generic type, it is proposed that from at least two galvanic isolation units the base terminals of a region are electrically conductively connected to one another and are connected to a base potential via a common fuse connected in series.

Unlike in the prior art, where a fuse is present for each galvanic isolation unit at the respective control signal terminal, the present invention proposes jointly utilizing a common fuse as overload protection element for at least two galvanic isolation units. This is achieved by the fuse being connected between the base potential and base terminals electrically conductively connected to one another. In the event of a current which flows through at least one of the galvanic isolation units and overloads the galvanic isolation unit, said current then flows away via the common fuse and triggers the fuse, i.e. the overload protection of the overload protection unit. In this regard, by way of example, the fusable filament of a fusable link can melt at such an elevated current and interrupt the current flow through the galvanic isolation units.

Thus, only a single common fuse is now required, instead of the plurality of fuses hitherto connected in the supply path of each galvanic isolation unit. Structural space and outlay for components are thus saved.

Since the entire assembly has to be replaced anyway in the event of a fault, no disadvantage arises as a result of the common safeguarding of the galvanic isolation units.

It is particularly advantageous if a further overvoltage protection element is in each case connected in parallel with an assigned galvanic isolation unit between the signal path leading to the signal unit assigned galvanic isolation unit and the signal path which is outgoing from the base output of the assigned galvanic isolation unit. With such an overvoltage protection element in each case connected in parallel with the galvanic isolation unit, the galvanic isolation unit is protected against excessively high voltages. A zener diode, in particular, is suitable as such as overvoltage protection element. In the event of an overvoltage, the corresponding current is then conducted away toward the base potential and the common fuse is triggered if the permissible maximum current is exceeded.

It is particularly advantageous if in each case a resistor is connected in series at the control signal terminal of the galvanic isolation unit and the overvoltage protection element acting as a limiting element lies with the interposed resistor in parallel with the control signal terminal and base terminal of a respective galvanic isolation element.

The overvoltage protection element serves for voltage limiting and is particularly advantageously embodied as a zener diode. A fuse, such as a fusable link, for example, is used as the overload protection element.

The control signal terminals of the galvanic isolation units are preferably connected directly or indirectly (e.g. with interposed resistors) to an assigned control signal output of a control unit. The control unit serves for driving the galvanic isolation units by means of control signals or for receiving control signals of a following galvanic isolation unit, which, with the aid of the galvanic isolation unit, are transmitted to the galvanically isolated other circuit region or received from said circuit region. The control unit used is, in particular, a microcontroller, microprocessor, FPGA (Field Programmable Gate Array) or ASIC (Application Specific Integrated Circuit), which is preferably part of an automation device (industrial controller, building automation, control of means of transport, etc.).

The galvanic isolation units are preferably connected to ground potential via a common overload protection element (fuse). However, it is also conceivable for the base outputs of the galvanic isolation units to be connected to supply voltage potential via the common overload protection element.

Particularly advantageously, optocouplers can be used as galvanic isolation units.

Figure 2:
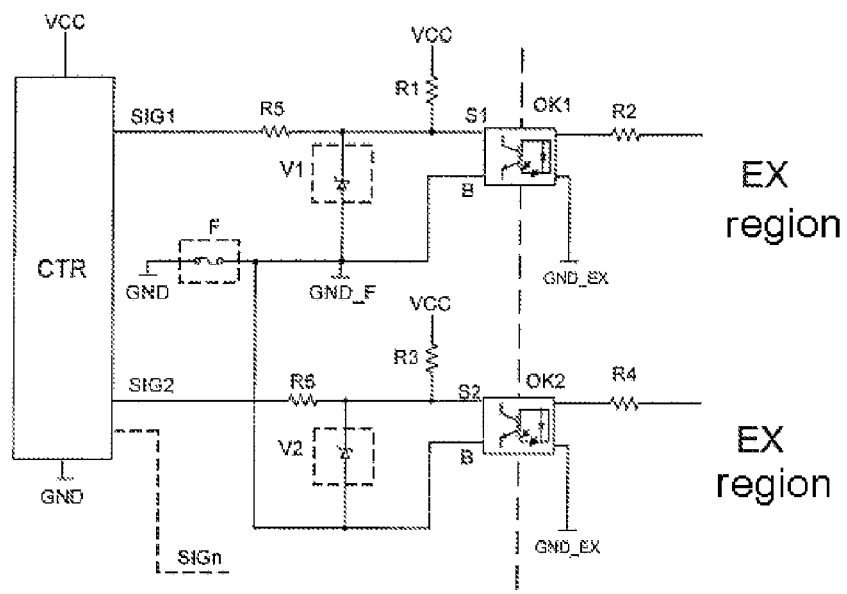
Figure 3:
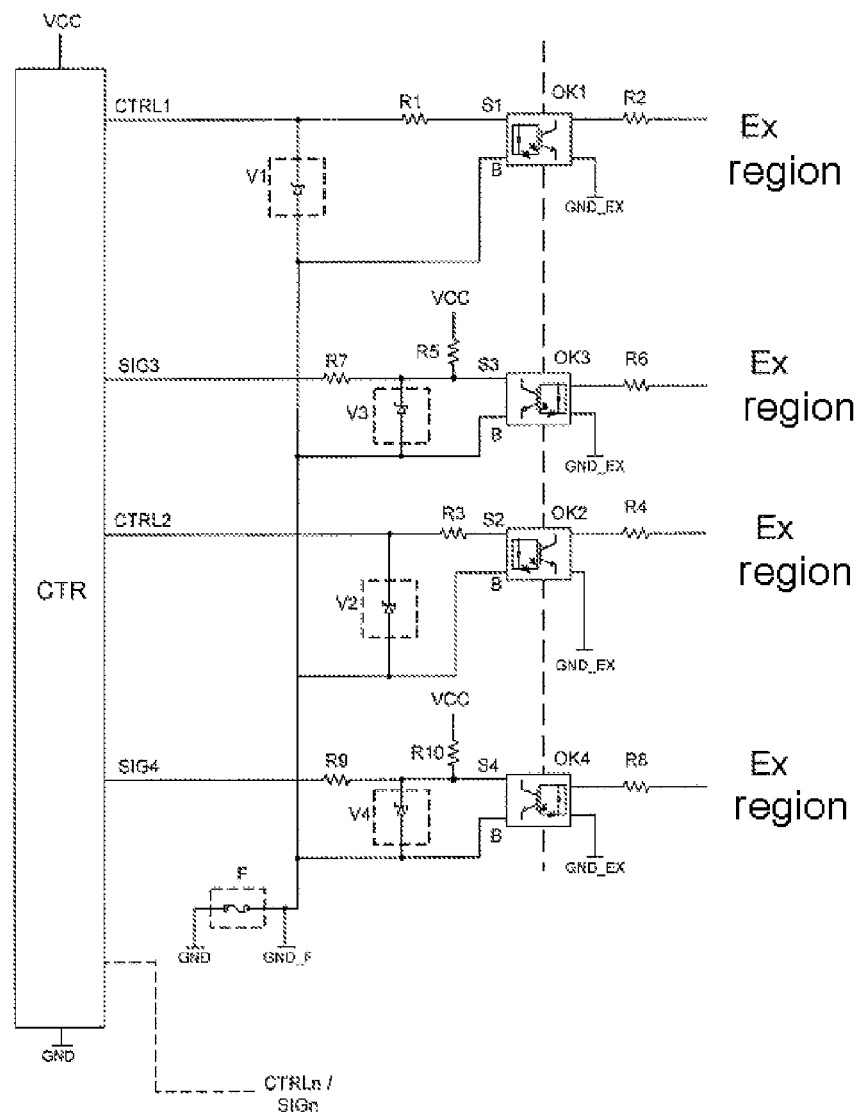

The invention is explained in greater detail by way of example below on the basis of exemplary embodiments with reference to the accompanying drawing in which:

FIG. 1—shows a diagram of a circuit arrangement with overload protection for optocouplers, for conducting signals from an EX region to a controller;

FIG. 2—shows a diagram of a circuit arrangement with overload protection for optocouplers for conducting signals from a controller into an EX region, and FIG. 3—shows a diagram of a circuit arrangement as a combination of the circuit arrangement from FIGS. 1 and 2.

FIG. 1 reveals a diagram of a circuit arrangement with which a number of at least two optocouplers OK1, OK2, ..., OK$_n$ as galvanic isolation units can be protected against overloading. The optocouplers OK1, OK2, ..., OK$_n$ are provided for the galvanic isolation of an intrinsically safe region (EX region) and a non-intrinsically safe region (left-hand region). The intrinsically safe region is, in particular, an explosion-protected region for which particular requirements are applicable, such as are defined e.g. in the standard DIN EN 60079-11 (VDE 0170-7).

In the non-explosion-protected region, the galvanic isolation units OK1, OK2, ..., OK$_n$ each have a control signal terminal S and a base terminal B. In the explosion-protected region EX region, a control signal terminal S_EX and a base terminal B_EX are provided in a corresponding manner. The signal terminal S_EX of the intrinsically safe region EX region is connected via a resistor R2 to a load to be driven (not illustrated). The base terminal B_EX is connected to ground potential GND_EX of the intrinsically safe region (EX region).

The galvanic isolation units OK1, OK2, ..., OK$_n$ embodied as optocouplers have in each case for the intrinsically safe region (EX region) an optical receiving unit for example in the form of a photodiode or a phototransistor T. In the non-intrinsically safe region, an optical transmitting unit for example in the form of a light-emitting diode in the visible or non-visible light wavelength range is present and connected to the control signal terminal S and base terminal B of the non-intrinsically safe region.

The circuit arrangement depicted schematically by way of example is thus provided for conducting signals from a control unit CTR to receivers (not illustrated) in the intrinsically safe region (EX region).

It becomes clear that the galvanic isolation elements OK1, OK2 are driven via control signal outputs CTRL1, CTRL2, ..., CTRL$_n$ of a control unit CTR. For this purpose, a resistor R1, R3, ... is connected in series between the control signal output CTRL1, CTRL2, ..., CTRL$_n$, and the respectively assigned control signal terminal S1, S2, ..., S$_n$ of the galvanic isolation element OK1, OK2, ..., OK$_n$.

In order to prevent an overvoltage across the non-intrinsically safe input (control signal terminal S and base terminal B of the galvanic isolation elements), an overvoltage protection element V1, V2, ..., V$_n$ (limiting element) is connected in parallel, wherein the series resistor R1, R3 is connected directly upstream of the control signal terminal S. The overvoltage protection element V1, V2, which can be embodied as a zener diode, in particular is thus connected with the interposed resistor R1, R3 in parallel with the control signal terminal S and the base terminal on the non-intrinsically safe side of the respective galvanic isolation element OK1, OK2, ..., OK$_n$.

It furthermore becomes clear that the base terminals B of the galvanic isolation elements OK1, OK2, ..., OK$_n$ are connected together, i.e. are connected to one another in a direct electrically conductive connection without an interposed further electronic component.

In the exemplary embodiment illustrated, the base terminals B are connected to a first ground region of the circuit arrangement. Via a common overload protection element, i.e. via the fuse F, the base terminals B are connected to a base potential GND.

With further galvanic isolation elements OK, optionally present, the base terminals of these further galvanic isolation units OK$_n$ can likewise be connected to ground GND_F and the base terminals of the other galvanic isolation units OK1, OK2, ..., OK$_n$. However, it is also conceivable for galvanic isolation units OK1, OK2, ..., OK$_n$ to be interconnected with one another in groups such that the base terminals B of a group are in each case connected to a common ground GND via a common fuse F. Such a group of galvanic isolation elements OK1, OK2, ..., OK$_n$ interconnected with one another can consist, for example, of two, three, four, five, six or more of such galvanic isolation units OK1, OK2, ..., OK$_n$.

FIG. 2 reveals a diagram of a circuit arrangement with which signals can be transmitted from the control unit CTR (Controller, ASIC or the like) via the optocouplers OK1, OK2, ..., OK$_n$ as galvanic isolation units into the intrinsically safe region (EX region) to loads/receivers arranged there. Here again the base terminals B of the optocouplers OK1, OK2, ..., OK$_n$ are connected to the base potential GND via a common fuse F.

In contrast to the variant in accordance with FIG. 1, the control signal terminals S of the optocouplers OK1, OK2, ..., OK$_n$ are connected to supply voltage potential VCC via a respective resistor R1, R3. The overload protection elements V1, V2, ..., V$_n$ are connected in parallel between the control signal terminal S1, S2 and the base terminal B of the assigned optocoupler OK1, OK2, ..., OK$_n$. The respective signal terminals SIG1, SIG2, ..., SIG$_n$ of the control unit CTR are in each case connected to an assigned control signal terminal S1, S2, ..., S$_n$ via a series resistor R5, R6, ....

The optocouplers OK1, OK2, ..., OK$_n$ are now connected such that a phototransistor is connected between the control signal terminal S1, S2 and the base terminal B a as optocoupler OK1, OK2, ..., OK$_n$. In the intrinsically safe region (EX region) there is then situated the optical transmitting unit in the form of a light-emitting diode, which is driven via a respective series resistor R2, R4 and is connected by its cathode to ground potential GND_EX of the intrinsically safe region (EX region).

In the exemplary embodiment illustrated, therefore, the optocouplers OK1, OK2, ..., OK$_n$ are interconnected exactly oppositely to the first variant in accordance with FIG. 1 between the region of the control unit CTR and the intrinsically safe region (EX region).

FIG. 3 reveals a diagram of a circuit arrangement in which the circuit arrangements in accordance with FIGS. 1 and 2 are combined with one another.

It can be discerned that independently of the signal direction from the control unit CDR into the intrinsically safe region (EX region) or vice versa and thus independently of the interconnection direction of the optocouplers OK1, OK2, OK3, OK4, ..., $OK_n$, the base terminals B of the optocouplers OK1, OK2, OK3, OK4, ..., $OK_n$ are all interconnected and connected to the base potential GND via a common fuse F.

Only the connection of the control signal inputs SIG3, SIG4, ..., $SIG_n$ and of the control signal outputs CTRL1, CTRL2, ..., $CTRL_n$ to the assigned control signal terminals S1, S2, S3, S4, ..., $S_n$ of the optocouplers OK1, OK2, OK3, OK4, ..., $OK_n$ is adapted to the signal direction in accordance with the variants shown for the signal directions in FIGS. 1 and 2 by the specific interconnection of the series-connected resistors R1, R3 and R7, R9 and for the control signal inputs by the pull-up resistors R5, R10 at supply voltage potential VCC.

The invention claimed is:

1. A circuit arrangement having an overload protection for galvanic isolation units for galvanic isolation from one another, wherein the galvanic isolation units each have two regions galvanically isolated from one another and one of the regions has a control signal terminal and a base terminal, wherein the circuit arrangement has at least two such galvanic isolation units, wherein from at least two of the galvanic isolation units the base terminals of a region are electrically conductively connected to one another and are connected to a base potential via a common fuse connected in series and the control signal terminals of the galvanic isolation units are connected directly or indirectly in each case to an assigned control signal terminal of a control unit.

2. The circuit arrangement according to claim 1, wherein an overvoltage protection element is in each case connected in parallel with an assigned galvanic isolation unit between the signal path leading to the control signal terminal of the assigned galvanic isolation unit and the signal path which is outgoing from the base terminal of the assigned galvanic isolation unit and is connected to the common fuse.

3. The circuit arrangement according to claim 2, wherein in each case a resistor is connected to the control signal terminal of the galvanic isolation units in series and the overvoltage protection element lies with the interposed resistor in parallel between the control signal terminal and base terminal of a region of the galvanic isolation unit.

4. The circuit arrangement according to claim 2, wherein the overvoltage protection elements are zener diodes.

5. The circuit arrangement according to claim 1, wherein the galvanic isolation units are optocouplers.

6. The circuit arrangement according to claim 1, wherein optocouplers in each case have a transmitting diode between the control signal terminal and the base terminal connected to the common fuse.

7. The circuit arrangement according to claim 1, wherein optocouplers in each case have a phototransistor between the control signal terminal and the base terminal connected to the common fuse for the purpose of outputting a control signal at the control signal terminal.

8. A circuit arrangement having an overload protection for galvanic isolation units for galvanic isolation from one another, comprising:
at least two galvanic isolation units each having two regions galvanically isolated from one another, one of the two regions having a control signal terminal and a base terminal,
wherein the base terminal for each of the at least two galvanic isolation units is electrically conductively connected to one another at a first node, the first node maintained at a base potential via a common fuse electrically connected between the first node and the base potential.

9. The circuit arrangement according to claim 8, further comprising an overvoltage protection element connected in parallel with a respective galvanic isolation unit between the signal path leading to the control signal terminal of the respective galvanic isolation unit and the signal path which is outgoing from the base terminal of the respective galvanic isolation unit connected to the common fuse.

10. The circuit arrangement according to claim 9, further comprising a resistor electrically connected in series to the control signal terminal of each galvanic isolation unit, and the overvoltage protection element is electrically in parallel with the resistor and between the control signal terminal and base terminal of a region of the galvanic isolation unit.

11. The circuit arrangement according to claim 9, wherein the overvoltage protection elements are zener diodes.

12. The circuit arrangement according to claim 8, wherein the control signal terminals of the galvanic isolation units are connected directly or indirectly to a respective control signal terminal of a control unit.

13. The circuit arrangement according to claim 8, wherein the galvanic isolation units are optocouplers.

14. The circuit arrangement according to claim 13, wherein the optocouplers include a transmitting diode electrically connected between the control signal terminal and the base terminal connected to the common fuse.

15. The circuit arrangement according to claim 13, wherein the optocouplers include a phototransistor electrically connected between the control signal terminal and the base terminal connected to the common fuse for outputting a control signal at the control signal terminal.

* * * * *